(12) United States Patent
Sawabe et al.

(10) Patent No.: US 8,390,113 B2
(45) Date of Patent: Mar. 5, 2013

(54) THERMOELECTRIC CONVERSION MODULE

(75) Inventors: Yoshinari Sawabe, Tsukuba (JP); Yuichi Hiroyama, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/255,294

(22) PCT Filed: Mar. 3, 2010

(86) PCT No.: PCT/JP2010/053451
§ 371 (c)(1),
(2), (4) Date: Sep. 29, 2011

(87) PCT Pub. No.: WO2010/103977
PCT Pub. Date: Sep. 16, 2010

(65) Prior Publication Data
US 2012/0018835 A1    Jan. 26, 2012

(30) Foreign Application Priority Data
Mar. 9, 2009  (JP) .................................. 2009-054760

(51) Int. Cl.
*H01L 23/34* (2006.01)
*H01L 35/28* (2006.01)
(52) U.S. Cl. ................ 257/718; 257/470; 257/E29.347; 136/203; 136/224
(58) Field of Classification Search ................... 257/470, 257/718, E29.347; 136/203, 224
See application file for complete search history.

(56) References Cited

U.S. PATENT DOCUMENTS
2003/0140957 A1    7/2003  Akiba

FOREIGN PATENT DOCUMENTS
JP    2002-368294 A    12/2002
JP    2004-088057 A    3/2004
(Continued)

OTHER PUBLICATIONS
Int'l Search Report issued Jun. 1, 2010 in Int'l Application No. PCT/JP2010/053451.
(Continued)

*Primary Examiner* — Matthew Reames
(74) *Attorney, Agent, or Firm* — Panitch Schwarze Belisario & Nadel LLP

(57) ABSTRACT

A pressing member is prevented from being damaged by heat, heat dissipation through the pressing member on the higher-temperature side and reduction in thermoelectric conversion efficiency due to it are suppressed, and good electrical conduction is achieved even if thermoelectric conversion elements and electrodes are not cemented through a binder. A lower-temperature side electrode 6 is projecting toward a higher-temperature side substrate 8 and the lower-temperature side electrode 6 is formed with slope faces 6a, 6b, and an angle θ of each of the slope face to a surface of a lower-temperature side substrate 7 is an acute angle. A face 3a of a p-type thermoelectric conversion element 3 in contact with the lower-temperature side electrode 6 is along one slope face 6a of the lower-temperature side electrode and a face 4b of an n-type thermoelectric conversion element 4 in contact with the lower-temperature side electrode 6 is along the other slope face 6b of the lower-temperature side electrode 6; the p-type thermoelectric conversion element 3 and the n-type thermoelectric conversion element 4 are in contact with the lower-temperature side electrode 6 through the respective slope faces; a pressing member 5 presses a portion on the lower-temperature side substrate side of an outside thermoelectric conversion element 10, toward the other outside thermoelectric conversion element 10.

5 Claims, 3 Drawing Sheets

FOREIGN PATENT DOCUMENTS

| | | |
|---|---|---|
| JP | 2006-319210 A | 11/2006 |
| JP | 2006-332443 A | 12/2006 |
| JP | 2007-294689 A | 11/2007 |
| JP | 2008-066459 A | 3/2008 |
| JP | 2008-270618 A | 11/2008 |
| JP | 2008-288535 A | 11/2008 |
| JP | 2009-032960 A | 2/2009 |

OTHER PUBLICATIONS

Int'l Preliminary Report on Patentability issued Oct. 18, 2011 in Int'l Application No. PCT/JP2010/053451.

THERMOELECTRIC CONVERSION MODULE

CROSS-REFERENCE TO RELATED APPLICATION

This application is a Section 371 of International Application No. PCT/JP2010/053451, filed Mar. 3, 2010, which was published in the Japanese language on Sep. 16, 2010, under International Publication No. WO 2010/103977 A1, and the disclosure of which is incorporated herein by reference.

TECHNICAL FIELD

The present invention relates to a thermoelectric conversion module.

BACKGROUND ART

In a thermoelectric conversion module wherein thermoelectric conversion elements and electrodes are cemented through a binder such as a solder or a brazing material, thermal stress occurs between the thermoelectric conversion elements and the electrodes on the higher-temperature side of the thermoelectric conversion module because of the difference between the thermal expansion coefficients of the thermoelectric conversion elements and the electrodes, so as to result in breakage of binding portions in some cases. In order to solve this problem, there are attempts to achieve good electrical conduction without cementing the thermoelectric conversion elements and the electrodes in the thermoelectric conversion module by soldering or brazing. Patent Literature 1 discloses the thermoelectric conversion module provided with pressing members to apply a pressing load from side faces on the higher-temperature side of the thermoelectric conversion elements toward the thermoelectric conversion elements.
Citation List
Patent Literature
  Patent Literature 1: JP 2008-270618A

SUMMARY OF INVENTION

Technical Problem

However, when the pressing members, e.g., such as springs are arranged on the higher-temperature side of the thermoelectric conversion module, the pressing members might be damaged by heat given from outside. In addition thereto, heat given from a heat source on the higher-temperature side to the thermoelectric conversion module is transmitted through the pressing members to dissipate to the outside, so as to decrease the temperature difference between the higher-temperature side and the lower-temperature side through the thermoelectric conversion elements, resulting in reduction of thermoelectric conversion efficiency of the thermoelectric conversion module.

An object of the present invention is to provide a thermoelectric conversion module capable of suppressing the damage of the pressing members by heat and suppressing the heat dissipation through the pressing means on the higher-temperature side and the reduction of thermoelectric conversion efficiency due to it, and capable of achieving good electrical conduction even in the case where the thermoelectric conversion elements and the electrodes are not cemented through the binder.

Solution to Problem

A thermoelectric conversion module according to the present invention comprises: a lower-temperature side substrate; a higher-temperature side substrate opposing to the lower-temperature side substrate; a lower-temperature side electrode arranged on a surface of the lower-temperature side substrate opposing to the higher-temperature side substrate; a higher-temperature side electrode arranged in a non-cemented state on a surface of the higher-temperature side substrate opposing to the lower-temperature side substrate; an n-type thermoelectric conversion element or a plurality of n-type thermoelectric conversion elements arranged between the lower-temperature side substrate and the higher-temperature side substrate; a p-type thermoelectric conversion element or a plurality of p-type thermoelectric conversion elements arranged between the lower-temperature side substrate and the higher-temperature side substrate; an insulating member arranged in each space between the p-type thermoelectric conversion element and the n-type thermoelectric conversion element; a substrate holding member holding the lower-temperature side substrate and the higher-temperature side substrate; and a pressing member.

The p-type thermoelectric conversion element and the n-type thermoelectric conversion element are arranged as alternating with each other in a direction along a plane parallel to the lower-temperature side substrate and the higher-temperature side substrate. The lower-temperature side electrode and higher-temperature side electrode are arranged so as to connect the p-type thermoelectric conversion element and the n-type thermoelectric conversion element in series. Each of the p-type thermoelectric conversion element and the n-type thermoelectric conversion element is in contact with the higher-temperature side electrode and the lower-temperature side electrode in a non-cemented state. The lower-temperature side electrode is projecting toward the higher-temperature side substrate. The lower-temperature side electrode has a slope face, and an angle of the slope face to the surface of the lower-temperature side substrate is an acute angle. The slope face is formed on each of both sides of the lower-temperature side electrode in the direction along the plane parallel to the lower-temperature side and higher-temperature side substrates. A face of the p-type thermoelectric conversion element in contact with the lower-temperature side electrode is along one of the slope faces of the lower-temperature side electrode and a face of the n-type thermoelectric conversion element in contact with the lower-temperature side electrode is along the other of the slope faces of the lower-temperature side electrode. The p-type thermoelectric conversion element and the n-type thermoelectric conversion element are in contact through the respective slope faces with the lower-temperature side electrode. The pressing member is arranged at a position closer to the lower-temperature side substrate away from the higher-temperature side substrate, and the pressing member presses a portion on the lower-temperature side substrate side of one thermoelectric conversion element out of two types of thermoelectric conversion elements arranged outermost among the p-type thermoelectric conversion element and the n-type thermoelectric conversion element, toward the other thermoelectric conversion element out of the two types of thermoelectric conversion elements arranged outermost among the p-type thermoelectric conversion element and the n-type thermoelectric conversion element.

According to the present invention, a pressing load on the p-type thermoelectric conversion element and the n-type thermoelectric conversion element by the pressing member is transferred through the slope faces and therefore it produces a load in a direction along the lower-temperature side substrate and the higher-temperature side substrate and a load in a direction perpendicular to the lower-temperature side substrate and the higher-temperature side substrate on each slope face. Therefore, the load from the lower-temperature side electrode toward the higher-temperature side electrode in the direction perpendicular to the lower-temperature side substrate and the higher-temperature side substrate acts on the p-type and the n-type thermoelectric conversion elements. This load achieves secure adhesion of each of the p-type thermoelectric conversion element and the n-type thermoelectric conversion element to the lower-temperature side electrode and the higher-temperature side electrode, whereby good electrical conduction is achieved between the p-type and n-type thermoelectric conversion elements and the lower-temperature side and higher-temperature side electrodes.

Since the higher-temperature side electrode and the higher-temperature side substrate, and, the lower-temperature side and higher-temperature side electrodes and the thermoelectric conversion elements are arranged each in a non-cemented state, the higher-temperature side electrode can move on the surface of the higher-temperature side substrate and the thermoelectric conversion elements can move on the surface of the lower-temperature side electrode or on the surface of the higher-temperature side electrode, for example, according to the magnitude of the pressing load by the pressing member or the acting position of the pressing load. For this reason, the aforementioned effect can be achieved extremely efficiently by the pressing member 5. The lower-temperature side electrode and the lower-temperature side substrate may be arranged either in a cemented state or in a non-cemented state.

Furthermore, since the pressing member is arranged at the position closer to the lower-temperature side substrate away from the higher-temperature side substrate, the pressing member becomes less likely to be exposed to high temperatures.

It is preferable that each of the two slope faces of the lower-temperature side electrode be a flat face. When the two slope faces of the lower-temperature side electrode are flat faces, the slope faces of the p-type and n-type thermoelectric conversion elements in contact with the lower-temperature side electrode are also flat faces corresponding to the two slope faces of the lower-temperature side electrode. When the two slope faces of the lower-temperature side electrode are flat faces, it is easy to process the slope faces of the lower-temperature side electrode and the slope faces of the p-type and n-type thermoelectric conversion elements and it is thus possible to decrease manufacturing cost of the thermoelectric conversion module. When the two slope faces of the lower-temperature side electrode are flat faces, the p-type and n-type thermoelectric conversion elements and the electrodes are more likely to come into close contact with each other and thus better electrical conduction is achieved between the p-type and n-type thermoelectric conversion elements and the electrodes.

It is preferable that each of the two slope faces of the lower-temperature side electrode be a convex face or a concave face. When each of the two slope faces of the lower-temperature side electrode is a convex face or a concave face, it is easy to process the slope faces of the lower-temperature side electrode and the slope faces of the p-type and n-type thermoelectric conversion elements and it is thus possible to decrease the manufacturing cost of the thermoelectric conversion module.

When each of the two slope faces of the lower-temperature side electrode is a convex face or a concave face, it is more preferable that the slope faces of the lower-temperature side electrode be formed of a material that can deform when the thermoelectric conversion elements are pressed by the pressing member.

Since the slope faces of the lower-temperature side electrode are composed of the material that can deform when the thermoelectric conversion elements are pressed by the pressing member, the slope faces of the lower-temperature side electrode can deform so as to be along the shape of the slope faces of the thermoelectric conversion elements. When each of the two slope faces of the lower-temperature side electrode is a convex face or a concave face, it is difficult in some cases to form the slope faces of the convex shape or the slope faces of the concave shape of the lower-temperature side electrode and the thermoelectric conversion elements so as to achieve mutual close contact between the lower-temperature side electrode and the thermoelectric conversion elements; however, when the slope faces of the lower-temperature side electrode are composed of the aforementioned material, the slope faces of the lower-temperature side electrode become more likely to come into close contact with the slope faces of the p-type and n-type thermoelectric conversion elements abutting therewith, whereby better electrical conduction is achieved between the p-type and n-type thermoelectric conversion elements and the electrodes.

It is preferable that at least one of the p-type thermoelectric conversion element and the n-type thermoelectric conversion element contain a metal powder, and concentrations of the metal powder in the one type of thermoelectric conversion element are such that the concentration in a region near a contact surface with the lower-temperature side electrode or a region near a contact surface with the higher-temperature side electrode is higher than the concentration in an intermediate region between the region near the contact surface with the lower-temperature side electrode and the region near the contact surface with the higher-temperature side electrode. This reduces the electrical resistance between the p-type and n-type thermoelectric conversion elements and the electrodes, whereby better electrical conduction is achieved between the p-type and n-type thermoelectric conversion elements and the electrodes.

Advantageous Effects of Invention

The present invention prevents the damage of the pressing means by heat, prevents the heat dissipation through the pressing means on the higher-temperature side and the reduction of thermoelectric conversion efficiency due to it, and achieves better electrical conduction even in the case where the thermoelectric conversion elements and the electrodes are not cemented through a binder.

DESCRIPTION OF EMBODIMENTS

Figure 1:
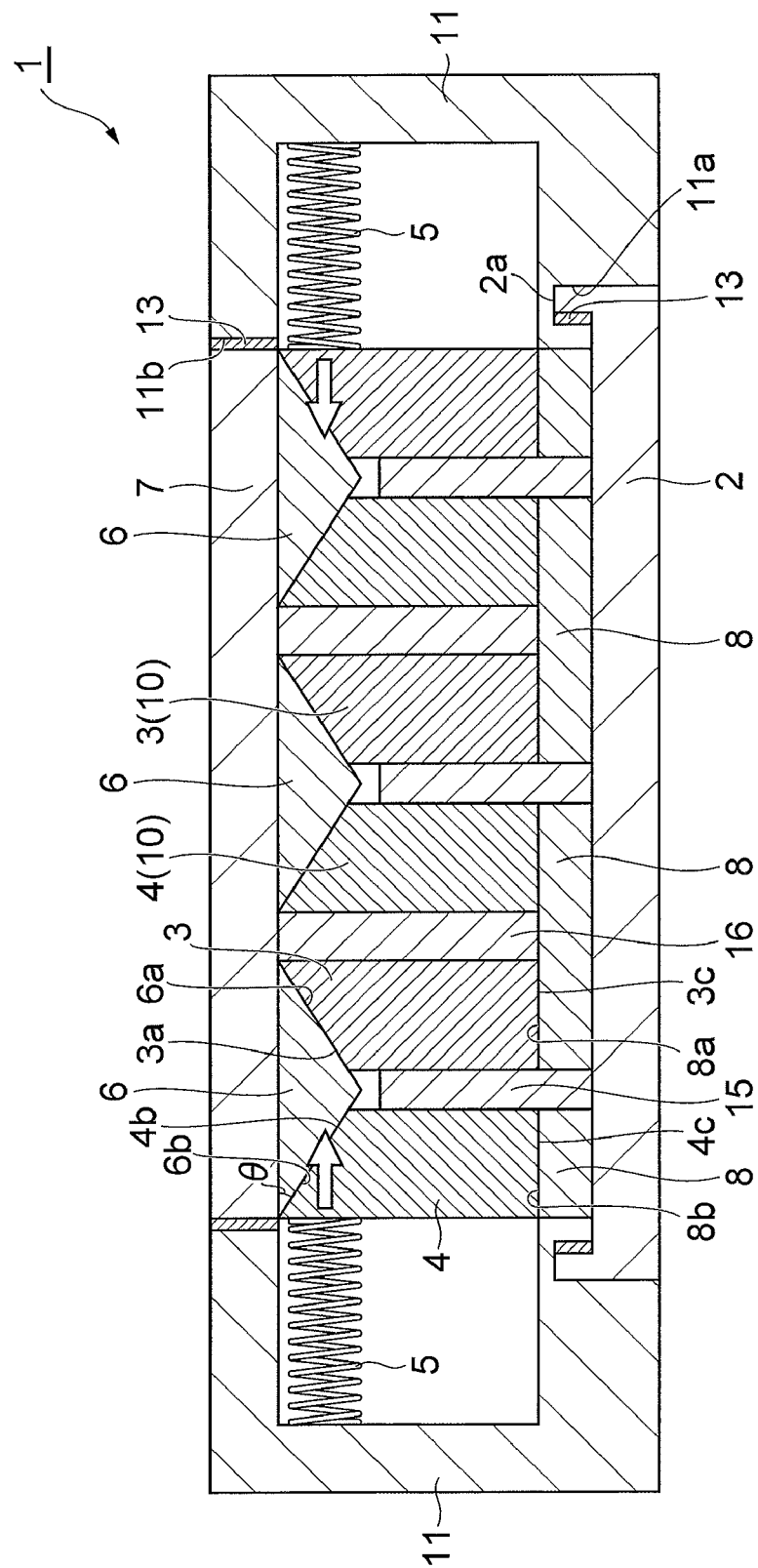
FIG. 1 is a schematic cross-sectional view of the thermoelectric conversion module according to the first embodiment of the present invention.

Preferred embodiments according to the present invention will be explained in detail, with reference to the attached drawings. In the description for the drawings, the same reference numerals will be put on the same or corresponding element, and overlapping descriptions will be omitted. In addition, a dimensional ratio in each drawing does not necessarily match an actual dimensional ratio.

First, the thermoelectric conversion module according to an embodiment of the present invention will be described.

(Thermoelectric Conversion Module of First Embodiment)

FIG. 1 is a schematic cross-sectional view of the thermoelectric conversion module according to the first embodiment. The thermoelectric conversion module 1 is provided with a thermoelectric conversion section having a lower-temperature side substrate 7, a higher-temperature side substrate 2, lower-temperature side electrodes 6, higher-temperature side electrodes 8, p-type thermoelectric conversion elements 3, n-type thermoelectric conversion elements 4, insulating members 15, and insulating members 16, pressing members 5, and substrate holding members 11.

[Thermoelectric Conversion Section]

In the thermoelectric conversion section, the lower-temperature side substrate 7 and the higher-temperature side substrate 2 oppose to each other and are arranged approximately in parallel. The lower-temperature side electrodes 6 are arranged in a non-cemented state on the surface of the lower-temperature side substrate 7 opposing to the higher-temperature side substrate 2, and the higher-temperature side electrodes 8 are arranged in a non-cemented state on the surface of the higher-temperature side substrate 2 opposing to the lower-temperature side substrate 7. The p-type thermoelectric conversion elements 3 and the n-type thermoelectric conversion elements 4 are arranged as alternating with each other in a direction parallel to the lower-temperature side substrate 7 and higher-temperature side substrate 2 (the horizontal direction in FIG. 1). The insulating members 15, 16 are arranged between the p-type thermoelectric conversion elements 3 and the n-type thermoelectric conversion elements 4 to prevent an electrical contact (short circuit) between side faces of the p-type thermoelectric conversion elements 3 and those of the n-type thermoelectric conversion elements 4.

(Lower-Temperature Side Substrate and Higher-Temperature Side Substrate)

There are no particular restrictions on the shape of the lower-temperature side substrate 7 and the higher-temperature side substrate 2 as long as it is a platelike one; for example, it can be a rectangular plate shape. The lower-temperature side substrate 7 and the higher-temperature side substrate 2 have electrical insulation and thermal conduction properties and are arranged at positions where the thermoelectric conversion elements 10 are held from their both ends between the substrates. Examples of materials of the substrates include alumina, aluminum nitride, boron nitride, magnesia, silicon carbide, and so on (Lower-Temperature Side Electrodes and Higher-Temperature Side Electrodes)

Each lower-temperature side electrode 6 connects one end faces of one p-type thermoelectric conversion element 3 and one n-type thermoelectric conversion element 4 to each other so as to pair the p-type thermoelectric conversion element 3 and the n-type thermoelectric conversion element 4 on the surface of the lower-temperature side substrate 7, thus forming one electrical binding portion.

Each higher-temperature side electrode 8 connects the other end faces of one type of thermoelectric conversion element 10 out of a pair of p-type thermoelectric conversion element 3 and n-type thermoelectric conversion element 4 one end faces of which are connected by a lower-temperature side electrode 6, and the other type of thermoelectric conversion element 10 out of an adjacent pair of p-type thermoelectric conversion element 3 and n-type thermoelectric conversion element 4, to each other on the higher-temperature side substrate 2. The higher-temperature side electrodes 8 are approximately of a flat plate shape.

Metal plates or the like used as the lower-temperature side electrodes 6 and the higher-temperature side electrodes 8 each are arranged on the surfaces of the lower-temperature side substrate 7 and the higher-temperature side substrate 2, without being mechanically cemented to the lower-temperature side substrate 7 and the higher-temperature side substrate 2 with a binder. This allows the lower-temperature side electrodes 6 and the higher-temperature side electrodes 8 to move in the presence of pressing loads by the pressing members 18 described below, whereby the electrodes become likely to come into close contact with the p-type thermoelectric conversion elements and the n-type thermoelectric conversion elements, so as to readily result in extremely good electrical conduction between the p-type and n-type thermoelectric conversion elements and the electrodes. In this manner, the plurality of p-type thermoelectric conversion elements 3 and the plurality of n-type thermoelectric conversion elements 4 are arranged so as to be connected in series by the lower-temperature side electrodes 6 and the higher-temperature side electrodes 8.

The lower-temperature side electrodes 6 and the higher-temperature side electrodes 8 can be formed, for example, using a metal sheet consisting of a laminate of metal plates, a single-layer metal sheet, a porous metal sheet, or the like.

The lower-temperature side electrode 6, at one electrical junction, has a shape projecting toward the higher-temperature side substrate. Each lower-temperature side electrode 6 has two slope faces 6a, 6b an angle θ of each of the face to the surface of the lower-temperature side substrate 7 is an acute angle, on both sides in the aforementioned predetermined direction parallel to the lower-temperature side substrate 7 and the higher-temperature side substrate 2, i.e., in the array direction of thermoelectric conversion elements 10 (the horizontal direction in FIG. 1). There are no particular restrictions on the angle θ as long as it is an acute angle or less than 90°; the angle θ is preferably from 15° to 75°.

In the present embodiment, the slope faces 6a, 6b of the lower-temperature side electrodes 6 are flat faces and the lower-temperature side electrodes 6 are approximately of a triangular prism shape whose axis is approximately along a direction perpendicular to the plane of FIG. 1. Each of the slope face 6a, 6b may be composed of a plurality of facets, but it is preferably composed of a single facet in terms of easiness to process. In the case where each of the slope face 6a, 6b of the lower-temperature side electrodes 6 is a flat face, the steric shape of the lower-temperature side electrodes 6 is normally a triangular prism. A p-type thermoelectric conversion element 3 is in contact with the slope face 6a and an n-type thermoelectric conversion element 4 is in contact with the other slope face 6b, both in a non-cemented state.

There are no particular restrictions on materials of the lower-temperature side electrodes 6 and the higher-temperature side electrodes 8 as long as they have an electrically conductive property; however, in terms of improvement in heat resistance, corrosion resistance, and adhesion to the thermoelectric conversion elements 10 of the electrodes, it is preferable to adopt a metal containing at least one element selected from the group consisting of titanium, vanadium, chromium, manganese, iron, cobalt, nickel, copper, molybdenum, silver, palladium, gold, tungsten, and aluminum, as a major ingredient. The major ingredient herein refers to an ingredient contained 50% by volume or more in the electrode material.

It is preferable that the lower-temperature side electrodes 6 be made of aluminum, copper, silver, gold, nickel, or iron in terms of formability of the slope faces serving as contact faces with the below-described thermoelectric conversion elements 10, and it is preferable that the higher-temperature side electrodes 8 be made of silver or gold in terms of easiness of processing of electrodes.

(Thermoelectric Conversion Elements)

There are no particular restrictions on the shape of the thermoelectric conversion elements 10, and examples thereof include hexahedrons such as a rectangular parallelepiped, hexagonal prisms, circular cylinders, and disks. There are no particular restrictions on a material making up each thermoelectric conversion element as long as it has the property of p-type semiconductor or n-type semiconductor; the thermoelectric conversion elements can be made using various materials such as metals and metal oxides.

Examples of the materials of the p-type thermoelectric conversion elements 3 and the n-type thermoelectric conversion elements 4 include the materials listed below.

Examples of the materials of the p-type thermoelectric conversion elements 3 include: mixed metal oxides such as $Na_xCoO_2$ (0<x<1) and $Ca_3Co_4O_9$; silicides such as $MnSi_{1.73}$, $Fe_{1-x}Mn_xSi_2$, $Si_{0.8}Ge_{0.2}$:B (B-doped $Si_{0.8}Ge_{0.2}$), and β-$FeSi_2$; skutterudites such as $CoSb_3$, $FeSb_3$, and $RFe_3CoSb_{12}$ (where R represents La, Ce, or Yb); Te-containing alloys such as BiTeSb, PbTeSb, $Bi_2Te_3$, $Sb_2Te_3$, and PbTe; $Zn_4Sb_3$, and so on.

Examples of the materials of the n-type thermoelectric conversion elements 4 include: mixed metal oxides such as $SrTiO_3$, $Zn_{1-x}Al_xO$, $CaMnO_3$, $LaNiO_3$, $BaTiO_3$, and $Ti_{1-x}Nb_xO$; silicides such as $Mg_2Si$, $Fe_{1-x}Co_xSi_2$, $Si_{0.8}Ge_{0.2}$:P (P-doped $Si_{0.8}Ge_{0.2}$), and β-$FeSi_2$; skutterudites such as $CoSb_3$; clathrate compounds such as $Ba_8Al_{12}Si_{30}$, $Ba_8Al_xSi_{46-x}$, $Ba_8Al_{12}Ge_{30}$, $Ba_8Al_xGe_{46-x}$, and $Ba_8Ga_xGe_{46-x}$; boron compounds such as $CaB_6$, $SrB_6$, $BaB_6$, and $CeB_6$; Te-containing alloys such as BiTeSb, PbTeSb, $Bi_2Te_3$, $Sb_2Te_3$, and PbTe; $Zn_4Sb_3$, and so on.

When consideration is given to situations where the thermoelectric conversion module is used at 300° C. or higher, It is preferable that the p-type thermoelectric conversion elements 3 and the n-type thermoelectric conversion elements 4 contain a metal oxide or a silicide as a major ingredient among the above-listed materials, in terms of heat resistance and oxidation resistance. Among the metal oxides, it is preferable to use $Ca_3Co_4O_9$ as material of the p-type thermoelectric conversion elements 3 and $CaMnO_3$ as material of the n-type thermoelectric conversion elements 4. $Ca_3Co_4O_9$ and $CaMnO_3$ have particularly superior oxidation resistance at high temperatures in the atmosphere and also have high thermoelectric conversion performance.

A face 3a of the p-type thermoelectric conversion element 3 in contact with the lower-temperature side electrode 6 is formed so as to be along one slope face 6a of the lower-temperature side electrode 6, and a face 4b of the n-type thermoelectric conversion element 4 in contact with the lower-temperature side electrode 6 is formed so as to be along the other slope face 6b of the lower-temperature side electrode 6; the faces 3a, 4b are in contact with the slope faces 6a, 6b, respectively, of the lower-temperature side electrode 6, each in a non-cemented state. The thermoelectric conversion elements 10 have no contact with the lower-temperature side electrodes 6, except for the slope faces 3a, 4b. Namely, the thermoelectric conversion elements 10 are in contact with the lower-temperature side electrodes 6 through the slope faces 3a, 4b only. The slope faces of the thermoelectric conversion elements formed so as to be along the slope faces of the lower-temperature side electrodes 6 refer to slope faces that can come into close contact with the slope faces of the lower-temperature side electrodes 6 without a space in between. Therefore, since the faces 4b and 3a are flat faces, angles of the faces 4b and 3a to the surface of the lower-temperature side substrate 7 are also approximately θ. These slope faces can be formed in the thermoelectric conversion elements 10 by cutting or polishing one of the two end faces of the thermoelectric conversion elements 10 opposing to each other so as to form the desired slope face. When the thermoelectric conversion elements 10 are manufactured by a below-described method of mixing raw material powders, charging the powders in a die or the like, pressing them, and thereafter firing them, the die into which the raw material powders are charged may be a die having the desired slope faces.

Faces 3c, 4c of the thermoelectric conversion elements 3 and the thermoelectric conversion elements 4 in contact with the higher-temperature side electrodes 8 are flat faces corresponding to surfaces 8a, 8b, respectively, of the higher-temperature side electrodes 8 of the flat plate shape.

For achieving better electrical conduction between the thermoelectric conversion elements 10 and the lower-temperature side and higher-temperature side electrodes 6 and 8, it is preferable that at least either of the p-type thermoelectric conversion elements 3 and the n-type thermoelectric conversion elements 4 contain a metal powder. In this case, it is preferable that concentrations of the metal powder in the thermoelectric conversion elements 10 be such that the concentration in a region near the contact face with the lower-temperature side electrode 6 and/or in a region near the contact face with the higher-temperature side electrode 8 is higher than that in an intermediate region between the region near the contact face with the lower-temperature side electrode 6 and the region near the contact face with the higher-temperature side electrode 8.

There are no particular restrictions on the metal powder, but it is preferable to use a noble metal powder resistant to oxidation at high temperatures, e.g., Pd, Ag, Pt, and Au powders, and it is more preferable to use the Ag powder in terms of manufacturing cost.

The concentration of the metal powder in the region near the contact face with the lower-temperature side electrode 6 or in the region near the contact face with the higher-temperature side electrode 8 (which will be referred to hereinafter as first layer) is set as follows: it is preferable that a ratio (molar ratio) of a molar quantity of the metal powder to a total molar quantity of the thermoelectric conversion element material and the metal powder therein be not less than 0.1, it is more preferable that the ratio be not less than 0.1 and not more than 0.9, and it is still more preferable that the ratio be not less than 0.3 and not more than 0.9. It is preferable that the ratio of the metal powder in the intermediate region between the region near the contact face with the lower-temperature side electrode 6 and the region near the contact face with the higher-temperature side electrode 8 (which will be referred to hereinafter as second layer) be as small as possible, and the intermediate region may contain no metal powder. From the viewpoint of making the temperature difference greater between the two ends in the thermoelectric conversion elements 10, it is preferable that a ratio of the thickness of the second layer to the thickness of the first layer be not less than 1 and it is more preferable that the ration be not less than 3.

Methods for manufacturing the p-type thermoelectric conversion elements 3 and the n-type thermoelectric conversion elements 4 are different depending upon materials making up the thermoelectric conversion elements 10, and, for example, in cases where the constituent material is an alloy, the thermoelectric conversion elements can be made by cutting a bulk body of an alloy in a desired shape. For example, in cases where the constituent material is a metal oxide, the thermoelectric conversion elements can be made by mixing compounds containing metal elements forming the metal oxide, sintering them in an oxygen-containing atmosphere, cutting the resultant sintered body, and thereafter shaping the sintered body into a desired shape.

A method of manufacturing the thermoelectric conversion element 10 containing the foregoing metal powder will be described specifically. For example, a die or the like is filled with a mixture powder of a raw material powder of the thermoelectric conversion element material and the metal powder (powder for the first layer) and a mixture powder of the powder of the thermoelectric conversion element material and the metal powder in the smaller quantity than the metal powder of the first layer (powder for the second layer), to form the powders in an intended shape such as a plate shape, a prism shape, or a circular cylinder shape. The forming can be performed, for example, by uniaxial press, cold isostatic press (CIP), mechanical press, hot press, hot isostatic press (HIP), or the like, after the powder for the first layer and the powder for the second layer are charged in order into the die or the like. More specifically, in the case where the thermoelectric conversion elements in the present invention are comprised of the first layer/the second layer/the first layer (/ indicates a binding interface), the charging of powders into the die can be carried out in the order of the powder for the first layer/the powder for the second layer/the powder for the first layer. The compact may contain a binder, a dispersant, a mold release agent, and so on. The sintering can be carried out under ordinary pressure, and the molding and sintering may be carried out at the same time by hot press, a pulse electric current sintering method, or the like.

The raw material powder of the thermoelectric conversion element, or the mixture powder of the raw material powder of the thermoelectric conversion element and the metal powder can be obtained by mixing raw materials of these powders. The mixing may be carried out by either of a dry mixing method and a wet mixing method and it is preferable to adopt a method allowing more uniform mixing; in this case, examples of mixing devices include devices such as a ball mill, a V-type mixer, a vibrating mill, an attritor, a Dyno-mill, and a dynamic mill.

(Insulating Members)

The insulating members 15, 16 interposed between the p-type thermoelectric conversion elements 3 and the n-type thermoelectric conversion elements 4 can be inorganic insulators such as alumina insulators, alumina-silicon carbide (SiC) insulators, and silica insulators, or organic insulators such as epoxy insulators. With consideration to the situations where the thermoelectric conversion module is used at 300° C. or higher, it is preferable to use the inorganic insulators, in terms of heat resistance.

The insulating members 15, 16 are provided for the following purposes: when the below-described pressing members 5 press the portions on the lower-temperature side substrate 6 side of the thermoelectric conversion elements 10 arranged outermost, they prevent the p-type thermoelectric conversion elements 3 and the n-type thermoelectric conversion elements 4 from coming into contact with each other; when a plurality of pairs of p-type thermoelectric conversion elements 3 and n-type thermoelectric conversion elements 4 are connected, they transmit the pressing loads given by the below-described pressing members 5, to the internal p-type thermoelectric conversion elements 3 and n-type thermoelectric conversion elements 4. An insulating member 15 is disposed between a pair of p-type thermoelectric conversion element 3 and n-type thermoelectric conversion element 4 in contact with an identical lower-temperature side electrode 6, and an insulating member 16 is disposed between a pair of p-type thermoelectric conversion element 3 and n-type thermoelectric conversion element 4 in contact with an identical higher-temperature side electrode 8.

Furthermore, the insulating members 15 are also interposed between the higher-temperature side electrodes 8, and the insulating members 16 are also interposed between the lower-temperature side electrodes 6, thereby preventing a short circuit between electrodes.

There are no particular restrictions on the thickness of the insulating members 15, but it is preferable that the thickness be approximately in the range of from 10 µm to 1 mm and it is more preferable that the thickness be approximately in the range of from 100 µm to 500 µm, in terms of ensuring sufficient insulation between the p-type thermoelectric conversion elements and the n-type thermoelectric conversion elements in the presence of the pressing loads by the pressing members, and in terms of ensuring a sufficient density of thermoelectric conversion elements. For the same reasons, it is preferable that the thickness of the insulating members 16 be approximately in the range of from 10 µm to 1 mm and it is more preferable that the thickness be approximately in the range of from 100 µm to 500 µm.

[Substrate Holding Members]

The substrate holding members 11 are members holding the lower-temperature side substrate 7 and the higher-temperature side substrate 2, and, particularly, they hold these substrates so as not to lengthen the distance between the lower-temperature side substrate 7 and the higher-temperature side substrate 2. There are no particular restrictions on the form of the substrate holding members 11 as long as they can implement the foregoing holding. For example, as shown in FIG. 1, the substrate holding members 11 can be constructed as follows: the higher-temperature side substrate 2 is provided with projections 2a, an engaging portion 11a to be engaged with the projection 2a of the higher-temperature side substrate 2 is provided at one end of each substrate holding member 11, an opposite face 11b opposing to a side face of the lower-temperature side substrate 7 is provided at the other end of each substrate holding member 11, and this opposite face 11b and the side face of the lower-temperature side substrate 7 are cemented with an adhesive. The projections 2a and the engaging portions 11a may be bonded with an adhesive 13. It is preferable that these adhesives be inorganic adhesives with heat resistance and examples thereof applicable herein include inorganic adhesives containing silica-alumina, silica, zirconia, or alumina as a major ingredient (e.g., SUMISERAM®-S (trade name available from ASAHI Chemical Co., Ltd.)), inorganic adhesives containing zirconia-silica as a major ingredient (e.g., Aron Ceramics (trade name available from TOAGOSEI CO., LTD.)), and so on. It is preferable that the substrate holding members 11 as described above be provided on both sides in the array direction of thermoelectric conversion elements 10, for the lower-temperature side substrate 7 and the higher-temperature side substrate 2, as shown in FIG. 1. The substrate holding members 11 may be made of a ceramic material such as zirconia, silicon nitride, porous alumina, cordierite, or mullite with lower thermal conductivity than the substrates 2, 7, particularly, in order to prevent heat dissipation through the substrate holding members 11 on the higher-temperature side.

[Pressing Members]

Each pressing member 5 is arranged between the substrate holding member 11 and the thermoelectric conversion element 10 arranged outermost out of the plurality of arrayed thermoelectric conversion elements 10 and at the position closer to the lower-temperature side substrate 7 away from the higher-temperature side substrate 2, and presses the portion of the thermoelectric conversion element 10 closer to the lower-temperature side substrate 7 toward the outermost thermoelectric conversion element 10 on the other side out of the arrayed thermoelectric conversion elements 10. It is preferable to provide the pressing members 5 on both sides in the array direction of thermoelectric conversion elements 10, for the array line of thermoelectric conversion elements 10. In a case where the pressing member 5 is provided on one side only, it becomes necessary to fix the thermoelectric conversion element on the other side to the substrates. There are no particular restrictions on the pressing members 5 as long as they can implement the press; It is preferable that they be elastic members such as springs and it is particularly preferable that they be metal springs. In the present invention, since the pressing members are located on the lower-temperature side, the pressing members 5, even if made of metal, are less likely to be affected by high temperatures, e.g., less likely to be damaged by oxidation.

In the thermoelectric conversion module of the first embodiment as described above, the mechanism described below ensures the secure close contact between the p-type and n-type thermoelectric conversion elements 3, 4 and the lower-temperature side and higher-temperature side electrodes 6, 8, so as to achieve good electrical conduction between the p-type and n-type thermoelectric conversion elements 3, 4 and the lower-temperature side and higher-temperature side electrodes 6, 8. Namely, since the pressing loads to the thermoelectric conversion elements 10 by the pressing members 5 are transferred through the slope faces 6a, 6b, 3a, 4b, there appear a load in the direction along the lower-temperature side substrate 6 and the higher-temperature side substrate 8 (horizontal direction) and a load in the direction perpendicular to the lower-temperature side substrate 7 and the higher-temperature side substrate 2, which is directed from the lower-temperature side to the higher-temperature side, at each interface between the lower-temperature side electrode 6 and the thermoelectric conversion element 10. Then the p-type thermoelectric conversion element 3 and the n-type thermoelectric conversion element 4 are subjected to the load directed from the lower-temperature side to the higher-temperature side in the direction perpendicular to the lower-temperature side substrate 7 and the higher-temperature side substrate 2, so as to enhance adhesion between the slope faces 3a, 4b of the thermoelectric conversion elements 10 and the slope faces 6a, 6b of the lower-temperature side electrodes 7 and also enhance adhesion between the faces 3c, 4c of the thermoelectric conversion elements 10 and the faces 8a, 8b of the higher-temperature side electrodes 8.

Since the non-cemented condition is maintained between the lower-temperature side electrodes 6 and the lower-temperature side substrate 7, between the higher-temperature side electrodes 8 and the higher-temperature side substrate 2, and between the lower-temperature side and higher-temperature side electrodes 6 and 8 and the thermoelectric conversion elements 10, the lower-temperature side electrodes 6 can move on the surface of the lower-temperature side substrate 7, the higher-temperature side electrodes 8 can move on the surface of the higher-temperature side substrate 2, and the thermoelectric conversion elements 10 can move on the slope faces 6a, 6b of the lower-temperature side electrodes 6 or on the surfaces of the higher-temperature side electrodes 8, for example, according to the magnitude of the pressing loads by the pressing members 5 or the acting position of the pressing loads. For this reason, the aforementioned effect can be efficiently achieved by the pressing members 5.

Thermoelectric Conversion Module of Second Embodiment

Figure 2:
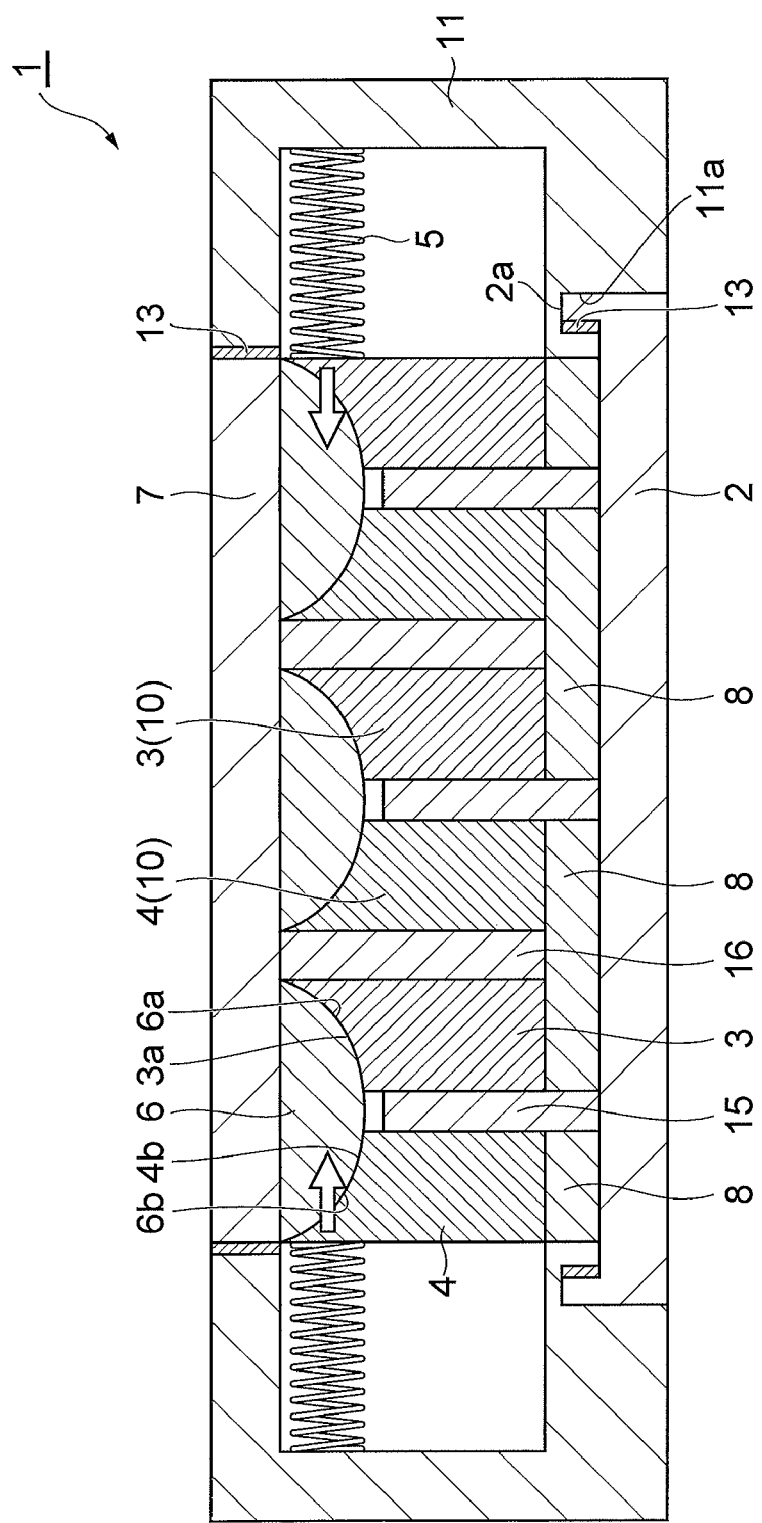
FIG. 2 is a schematic cross-sectional view of the thermoelectric conversion module according to the second embodiment of the present invention.

The following will describe the thermoelectric conversion module of the second embodiment shown in FIG. 2. The thermoelectric conversion module of the second embodiment is different from the first embodiment in that the slope faces 6a, 6b of the lower-temperature side electrodes 6 are not flat faces but convex faces and, corresponding thereto, the faces 3a of the p-type thermoelectric conversion elements 3 and the faces 4b of the n-type thermoelectric conversion elements 4 are concave faces. As shown in FIG. 2, in the case where the slope faces of the lower-temperature side electrodes 6 are convex faces, the steric shape of the lower-temperature side electrodes 6 is, for example, a semispherical shape, or a shape obtained by cutting a circular cylinder by a plane parallel to its axis.

Here, that the angle of each slope face 6a, 6b of the lower-temperature side electrode 6 with respect to the surface of the lower-temperature side substrate 7 is an acute angle means that when the lower-temperature side electrode 6 is cut perpendicularly to the lower-temperature side substrate 7 and in parallel with the array direction of the thermoelectric conversion elements 10, as shown in FIG. 2, an angle $\theta$ between a tangent line at any point on the periphery of the convex shape of the lower-temperature side electrode 6 in the portion of the lower-temperature side electrode 6 in contact with the thermoelectric conversion element 10, and the lower-temperature side substrate 7, is an acute angle.

Thermoelectric Conversion Module of Third Embodiment

Figure 3:
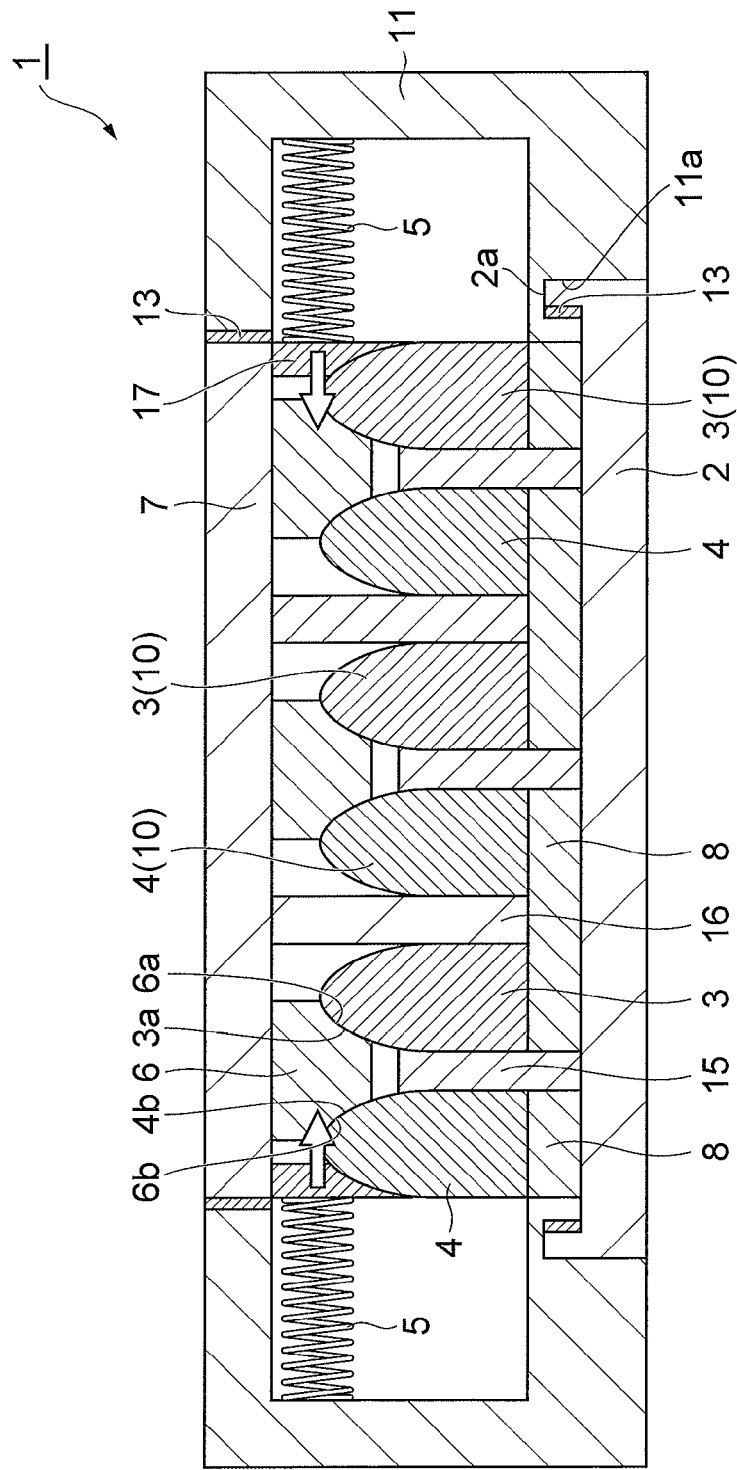
FIG. 3 is a schematic cross-sectional view of the thermoelectric conversion module according to the third embodiment of the present invention.

The following will describe the thermoelectric conversion module of the third embodiment shown in FIG. 3. The thermoelectric conversion module 1 of the third embodiment is different from the first embodiment in that the slope faces 6a, 6b of the lower-temperature side electrodes 6 are not flat faces but concave faces and, corresponding thereto, the faces 3a of the p-type thermoelectric conversion elements 3 and the faces 4b of the n-type thermoelectric conversion elements 4 are convex faces. As shown in FIG. 3, in the case where the slope faces of each lower-temperature side electrode 6 are concave faces, the steric shape of the lower-temperature side electrode 6 is, for example, one having a pair of grooves of an arc-like cross section, or one having a pair of semispherical concave faces. In the third embodiment, each pressing member 5 presses the thermoelectric conversion element 10 through a spacer 17.

Here, that the angle of each slope face 6a, 6b of the lower-temperature side electrode 6 with respect to the surface of the lower-temperature side substrate 7 is an acute angle means that when the lower-temperature side electrode 6 is cut perpendicularly to the lower-temperature side substrate 7 and in parallel with the array direction of the thermoelectric conversion elements 10, as shown in FIG. 3, an angle $\theta$ between a tangent line at any point on the periphery of the concave shape of the lower-temperature side electrode 6 in the portion of the lower-temperature side electrode 6 in contact with the thermoelectric conversion element 10, and the lower-temperature side substrate 7, is an acute angle.

In the thermoelectric conversion modules of the second and third embodiments described above, processing of the convex and concave faces of the lower-temperature side electrodes 6 can be performed, for example, by multilayer screen printing, precision lathe working, or the like, and processing of the convex and concave faces of the thermoelectric conversion elements 10 can be performed, for example, by isostatic press molding with a rubber die or the like.

In the thermoelectric conversion modules of the second and third embodiments, the slope faces 6a, 6b of the lower-temperature side electrodes 6 are preferably made of a material that can deform when the thermoelectric conversion elements 10 are pressed by the pressing members 5. Examples of such materials include soft metals such as aluminum, gold, silver, indium, tin, and zinc, metal meshes, foamed metals, and so on. A foamed metal is a porous metal body having the same three-dimensional mesh structure as a foamed resin body and is characterized by a high porosity (void ratio). Examples of materials of the metal meshes and foamed metals include Cu, Ni, Al, Au, Ag, Pt, stainless steel, Ni alloys, Co alloys, Cu alloys, Ti alloys, and so on.

The second and third embodiments also achieve the same operational effect as the first embodiment. Furthermore, since the slope faces 6a, 6b of the lower-temperature side electrodes 6 are made of the material as described above, the slope faces 6a, 6b of the lower-temperature side electrodes 6 can deform so as to fit the shape of the slope faces of the thermoelectric conversion elements 10. In the cases where each of two slope faces 6a, 6b of lower-temperature side electrode 6 is convex faces or concave faces, it is sometimes not easy to form the slope faces of the convex shape or the slope faces of the concave shape capable of achieving perfect close contact between the lower-temperature side electrodes 6 and the thermoelectric conversion elements 10 for each of lower-temperature side electrode 6 and thermoelectric conversion element 10 and, even in such cases, the slope faces 6a, 6b of the lower-temperature side electrode 6 become easier to make close contact with the slope face of the p-type thermoelectric conversion element and the slope face of the n-type thermoelectric conversion element abutting therewith, whereby better electrical conduction can be achieved between the p-type and n-type thermoelectric conversion elements and the electrode.

The above specifically described the thermoelectric conversion modules of the embodiments of the present invention, but the present invention is by no means limited to the above embodiments. In the embodiments the lower-temperature side electrodes 6 and the lower-temperature side substrate 7 are kept in the non-cemented state, but the present invention can also be carried out, for example, even in a configuration where the lower-temperature side electrodes 6 and the lower-temperature side substrate 7 are mechanically cemented through a binder or the like.

List of Reference Signs

1 thermoelectric conversion module; 2 higher-temperature side substrate; 3 p-type thermoelectric conversion elements; 4 n-type thermoelectric conversion elements; 5 pressing members; 6 lower-temperature side electrodes; 7 lower-temperature side substrate; 8 higher-temperature side electrodes; 10 thermoelectric conversion elements; 11 substrate holding members; 13 adhesive; 15, 16 insulating members; 17 spacers; 3a contact surface of p-type thermoelectric conversion element with lower-temperature side electrode; 4b contact surface of n-type thermoelectric conversion element with lower-temperature side electrode; 6a contact surface of lower-temperature side electrode with p-type thermoelectric conversion element; 6b contact surface of lower-temperature side electrode with n-type thermoelectric conversion element.

The invention claimed is:

1. A thermoelectric conversion module comprising:
a lower-temperature side substrate;
a higher-temperature side substrate opposing to the lower-temperature side substrate;
a lower-temperature side electrode arranged on a surface of the lower-temperature side substrate opposing to the higher-temperature side substrate;
a higher-temperature side electrode arranged in a non-cemented state on a surface of the higher-temperature side substrate opposing to the lower-temperature side substrate;
an n-type thermoelectric conversion element or a plurality of n-type thermoelectric conversion elements arranged between the lower-temperature side substrate and the higher-temperature side substrate;
a p-type thermoelectric conversion element or a plurality of p-type thermoelectric conversion elements arranged between the lower-temperature side substrate and the higher-temperature side substrate;
an insulating member arranged in each space between the p-type thermoelectric conversion element and the n-type thermoelectric conversion element;
a substrate holding member holding the lower-temperature side substrate and the higher-temperature side substrate; and
a pressing member,
wherein the p-type thermoelectric conversion element and the n-type thermoelectric conversion element are arranged as alternating with each other in a direction along a plane parallel to the lower-temperature side substrate and the higher-temperature side substrate,
wherein the lower-temperature side electrode and higher-temperature side electrode are arranged so as to connect the p-type thermoelectric conversion element and the n-type thermoelectric conversion elements in series,
wherein each of the p-type thermoelectric conversion element and the n-type thermoelectric conversion element is in contact with the higher-temperature side electrode and the lower-temperature side electrode in a non-cemented state,
wherein the lower-temperature side electrode has a slope face, an angle of the slope face to the surface of the lower-temperature side substrate is an acute angle, and the slope face is formed on each of both sides of the electrode in said direction,
wherein a face of the p-type thermoelectric conversion element in contact with the lower-temperature side electrode is along one of the slope faces of the lower-temperature side electrode,
wherein a face of the n-type thermoelectric conversion element in contact with the lower-temperature side electrode is along the other of the slope faces of the lower-temperature side electrode,
wherein the p-type thermoelectric conversion element and the n-type thermoelectric conversion element are in contact through the respective slope faces with the lower-temperature side electrode, and
wherein the pressing member is arranged at a position closer to the lower-temperature side substrate away from the higher-temperature side substrate, and the pressing member presses a portion on the lower-temperature side substrate side of one thermoelectric conversion element out of two types of thermoelectric conversion elements arranged outermost among the p-type thermoelectric conversion element and the n-type thermoelectric conversion element, toward the other thermoelectric conversion element out of the two types of thermoelectric conversion elements arranged outermost among the p-type thermoelectric conversion element and the n-type thermoelectric conversion element.

2. The thermoelectric conversion module according to claim 1, wherein each of the two slope faces of the lower-temperature side electrode is a flat face.

3. The thermoelectric conversion module according to claim 1, wherein each of the two slope faces of the lower-temperature side electrode is a convex face or a concave face.

4. The thermoelectric conversion module according to claim 3, wherein the slope faces of the lower-temperature side electrode are formed of a material that can deform when the thermoelectric conversion elements are pressed by the pressing member.

5. The thermoelectric conversion module according to claim 1, wherein at least one of the p-type thermoelectric conversion element and the n-type thermoelectric conversion element contains a metal powder, and wherein concentrations of the metal powder in at least one type of the thermoelectric conversion elements are such that the concentration in a region near a contact surface with the lower-temperature side electrode or a region near a contact surface with the higher-temperature side electrode is higher than the concentration in an intermediate region between the region near the contact surface with the lower-temperature side electrode and the region near the contact surface with the higher-temperature side electrode.

* * * * *